(12) United States Patent
Ding et al.

(10) Patent No.: US 10,672,151 B1
(45) Date of Patent: Jun. 2, 2020

(54) SYSTEMS AND METHODS FOR MAGNETIC RESONANCE IMAGE RECONSTRUCTION

(71) Applicant: UIH AMERICA, INC., Houston, TX (US)

(72) Inventors: Yu Ding, Houston, TX (US); Jingyuan Lyu, Houston, TX (US); Qi Liu, Houston, TX (US); Jian Xu, Houston, TX (US)

(73) Assignee: UIH AMERICA, INC., Houston, TX (US)

( * ) Notice: Subject to any disclaimer, the term of this patent is extended or adjusted under 35 U.S.C. 154(b) by 0 days.

(21) Appl. No.: 16/241,042

(22) Filed: Jan. 7, 2019

(51) Int. Cl.
*G01V 3/00* (2006.01)
*G06T 11/00* (2006.01)
*G01R 33/561* (2006.01)
*G01R 33/48* (2006.01)
*G01R 33/56* (2006.01)

(52) U.S. Cl.
CPC ........ *G06T 11/003* (2013.01); *G01R 33/4818* (2013.01); *G01R 33/5608* (2013.01); *G01R 33/5615* (2013.01)

(58) Field of Classification Search
USPC .......................................... 324/309
See application file for complete search history.

(56) References Cited

U.S. PATENT DOCUMENTS

| 4,509,015 | A | * | 4/1985 | Ordidge | G01R 33/5615 324/307 |
| 5,119,027 | A | * | 6/1992 | Ehrhardt | G01R 33/56 324/307 |
| 5,420,510 | A | * | 5/1995 | Fairbanks | G01R 33/446 324/300 |
| 6,434,412 | B1 | | 8/2002 | Simonetti et al. | |
| 9,939,509 | B2 | | 4/2018 | Ahmad et al. | |
| 2014/0212012 | A1 | * | 7/2014 | Fain | G01R 33/5601 382/131 |

OTHER PUBLICATIONS

P Kellman et al., Adaptive Sensitivity Encoding Incorporating Temporal Filtering (TSENSE), Magnetic Resonance in Medicine, 45:846-852 (2001).
R Ahmad et al., Variable Density Incoherent Spatiotemporal Acquisition (VISTA) for Highly Accelerated Cardiac MRI, Magnetic Resonance in Medicine, 74(5):1266-1278 (2015).

* cited by examiner

*Primary Examiner* — Rodney E Fuller
(74) *Attorney, Agent, or Firm* — Metis IP LLC

(57) ABSTRACT

Systems and methods for magnetic resonance imaging (MRI) are provided. The systems may obtain a sampling pattern associated with an image sequence. The sampling pattern may be associated with a plurality of phase encoding gradient field values. The systems may also obtain k-space data associated with the image sequence using the sampling pattern. The systems may further reconstruct the image sequence based on the k-space data. The sampling pattern may include a plurality of sampling points. Each of the plurality of sampling points may denote a k-space line associated with the k-space data. Each of the plurality of phase encoding gradient field values may correspond to one single sampling point during a time period associated with at least two consecutive images in the image sequence.

20 Claims, 8 Drawing Sheets

SYSTEMS AND METHODS FOR MAGNETIC RESONANCE IMAGE RECONSTRUCTION

TECHNICAL FIELD

This disclosure generally relates to magnetic resonance imaging (MRI) technology, and more particularly, to methods and systems for determining a sampling pattern for real-time MRI image reconstruction.

BACKGROUND

Magnetic resonance imaging (MRI) systems are widely used in medical diagnose. For example, cardiac magnetic resonance imaging (CMR) techniques are widely used in a routine examination for the heart of a patient. As another example, real-time MRI techniques can continuously monitor an object (e.g., a patient) to be scanned by the MRI systems in real-time and continuously collect multiple consecutive images of the object during a time period. Currently, an MR cardiac cine technique may be used to reconstruct an image sequence of the heart by combining the cardiac magnetic resonance imaging (CMR) techniques and real-time MRI techniques. However, the MR cardiac cine techniques currently use an ECG-gating technique or a segmented acquisition technique to collecting MR signals, which needs a patient to hold a breath for a time period and can not be applied for a patient with arrhythmia. Thus, it is desirable to provide systems and methods for real-time MR image reconstruction with improved sampling.

SUMMARY

According to an aspect of the present disclosure, a system for magnetic resonance imaging (MRI) is provided. The system may include at least one storage device storing executable instructions, and at least one processor in communication with the at least one storage device. When executing the executable instructions, the at least one processor may perform the following operations. The at least one processor may obtain a sampling pattern associated with an image sequence. The sampling pattern may be associated with a plurality of phase encoding gradient field values. The at least one processor may also obtain k-space data associated with the image sequence using the sampling pattern. The at least one processor may also reconstruct the image sequence based on the k-space data. The sampling pattern may include a plurality of sampling points. Each of the plurality of sampling points may denote a k-space line associated with the k-space data. Each of the plurality of phase encoding gradient field values may correspond to one single sampling point during a time period associated with at least two consecutive images in the image sequence.

In some embodiments, the sampling pattern may be pseudo-random in a k-space direction.

In some embodiments, at least one segment of the sampling pattern along a phase encoding dimension may not repeat itself in the time period.

In some embodiments, locations of the plurality of sampling points on the sampling pattern may be arranged periodically along a time dimension associated with the sampling pattern.

In some embodiments, the sampling pattern may include one or more blocks arranged in a two-dimensional space defined by a time dimension and a phase encoding dimension. Each of the one or more blocks may include a pre-determined number of sampling points. The pre-determined number of sampling points in each block may correspond to different phase encoding gradient field values and time values.

In some embodiments, the sampling patter may include at least two segments along a phase encoding dimension of the sampling pattern. Phase encoding gradient field values associated with each of the at least two segments may correspond to a same number of sampling points.

In some embodiments, each of the phase encoding gradient field values associated with each of the at least two segments may correspond to one single sampling point during a same time period.

In some embodiments, the at least two segments may include a first segment and a second segment. A phase encoding gradient field value associated with the first segment may correspond to one single sampling point during a first time period. A phase encoding gradient field value associated with the second segment may correspond to one single sampling point during a second time period different from the first time period.

In some embodiments, each of the at least two segments may include one or more blocks arranged along a time dimension of the sampling pattern. Each of one or more blocks in each of the at least two segments may include a pre-determined number of sampling points. The pre-determined number of sampling points in each block may correspond to different phase encoding gradient field values and time values.

In some embodiments, the pre-determined number of sampling points on each of the one or more blocks in each of the at least two segments may be different.

In some embodiments, locations of sampling points on each block in at least one of the at least two segments may be the same or different.

In some embodiments, the image sequence may include a plurality of consecutive images. To obtain k-space data associated with the image sequence using the sampling patter, the at least one processor may further identify a plurality of sampling trajectories from the target sampling patter. Each of the plurality of sampling trajectories may correspond to one of the plurality of consecutive images. Each of the plurality of sampling trajectories may include a plurality of sampling points arranged in a time sequence. The at least one processor may also determine a pulse sequence based on the plurality of sampling trajectories. The at least one processor may also collect MR signals based on the pulse sequence. The at least one processor may also determine the k-space data associated with the image sequence based on the MR signals.

In some embodiments, a number of the plurality of sampling points on each of the plurality of sampling trajectories may be the same.

In some embodiments, phase encoding gradient field values corresponding to the plurality of sampling points on at least one of the plurality of sampling trajectories may vary in a descending order or an ascending order.

In some embodiments, directions of sampling trajectories with respect to two neighboring images may be different. A direction of a sampling trajectory may be defined by a change of phase encoding gradient field values corresponding to the plurality of sampling points.

In some embodiments, the sampling trajectories with respect to two neighboring images may share a sampling point at a phase coding gradient field value. The phase coding gradient field value may be a maximum or minimum of the plurality of phase encoding gradient field values associated with the sampling pattern.

In some embodiments, to reconstruct the image sequence based on the k-space data, the at least one processor may further average at least one portion of the k-space data along the time dimension of the sampling pattern to obtain reference k-space data associated with the image sequence. The at least one processor may also reconstruct the image sequence based on the reference k-space data.

According to another aspect of the present disclosure, a method for magnetic resonance imaging (MRI) implemented on a computing apparatus is provided. The computing apparatus may include at least one processor and at least one storage device. The method may include obtaining a sampling pattern associated with an image sequence. The sampling pattern may be associated with a plurality of phase encoding gradient field values. The method may also include obtaining k-space data associated with the image sequence using the sampling pattern. The method may further include reconstructing the image sequence based on the k-space data. The sampling pattern may include a plurality of sampling points. Each of the plurality of sampling points may denote a k-space line associated with the k-space data. Each of the plurality of phase encoding gradient field values may correspond to one single sampling point during a time period associated with at least two consecutive images in the image sequence.

According to another aspect of the present disclosure, a non-transitory computer-readable medium storing at least one set of instructions is provided. When executed by at least one processor, the at least one set of instructions may direct the at least one processor to perform the following operations. The at least one processor may obtain a sampling pattern associated with an image sequence. The sampling pattern being associated with a plurality of phase encoding gradient field values. The at least one processor may also obtain k-space data associated with the image sequence using the sampling pattern. The at least one processor may also reconstruct the image sequence based on the k-space data. The sampling pattern may include a plurality of sampling points. Each of the plurality of sampling points may denote a k-space line associated with the k-space data. Each of the plurality of phase encoding gradient field values may correspond to one single sampling point during a time period associated with at least two consecutive images in the image sequence.

According to another aspect of the present disclosure, a system for magnetic resonance imaging (MRI) is provided. The system may include at least one storage device storing executable instructions, and at least one processor in communication with the at least one storage device. When executing the executable instructions, the at least one processor may perform the following operations. The at least one processor may determine one or more of blocks associated with a plurality of phase encoding gradient field values. Each of the one or more of blocks may be denoted by a square array including a plurality of rows of points. Each of the plurality of rows of points may be associated with one of the plurality of phase encoding gradient field values. The at least one processor may also determine a plurality of first sampling points from each of the one or more of blocks. Each of the plurality of phase encoding gradient field values may correspond to one single of the plurality of first sampling points. The at least one processor may also determine a sampling pattern based on the plurality of first sampling points in each of the one or more of blocks. The at least one processor may also obtain k-space data associated with the image sequence using the sampling pattern. The at least one processor may also reconstruct the image sequence based on the k-space data.

According to another aspect of the present disclosure, a system for magnetic resonance imaging (MRI) is provided. The system may include at least one storage device storing executable instructions, and at least one processor in communication with the at least one storage device. When executing the executable instructions, the at least one processor may perform the following operations. The at least one processor may obtain a preliminary sampling pattern associated with an image sequence. The preliminary sampling pattern may be defined by a phase encoding dimension and a time dimension. The at least one processor may also classify the preliminary sampling patter into one or more segments along the phase encoding dimension. The at least one processor may also classify each of the one or more segments into a plurality of blocks. Each of the one or more of blocks may be denoted by a square array including a plurality of rows of points. The at least one processor may also determine a plurality of sampling points from each row of the plurality of rows of points in each of the plurality of blocks. The plurality of sampling points may be corresponding to different time values. The at least one processor may also determine a target sampling pattern including the plurality of sampling points in the each of the plurality of blocks. Each of the plurality of sampling points may represent a readout line along a frequency encoding direction. The at least one processor may also obtain k-space data associated with the image sequence using the target sampling pattern. The at least one processor may also reconstruct images in the image sequence based on the k-space data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

It will be understood that the term "system," "engine," "unit," "module," and/or "block" used herein are one method to distinguish different components, elements, parts, section or of different level in ascending order. However, the terms may be displaced by another expression if they may achieve the same purpose.

Figure 2:
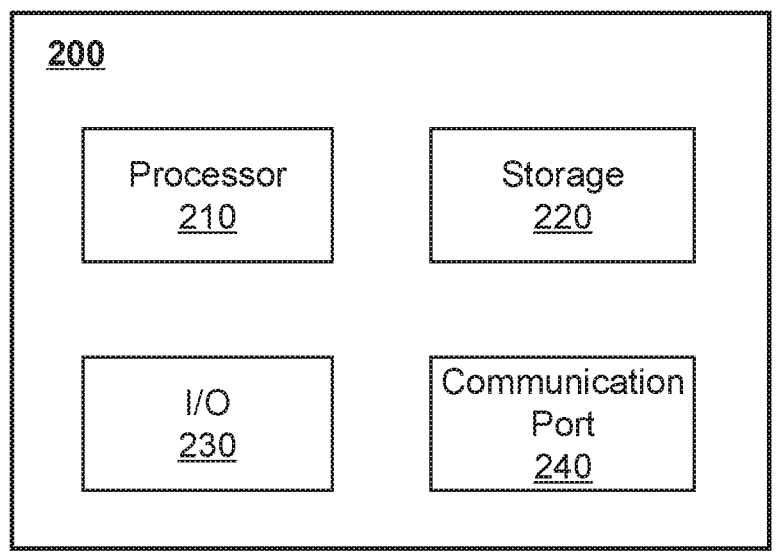
FIG. 2 is a schematic diagram illustrating hardware and/or software components of an exemplary computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 220 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Erasable Programmable Read Only Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

The present disclosure relates to methods and systems for real-time MRI image reconstruction. The method may include determining a sampling pattern associated with an image sequence, the sampling pattern being associated with a plurality of phase encoding gradient field values. The image sequence may correspond to a plurality of consecutive images. In some embodiments, the sampling pattern may include a plurality of blocks arranged along a phase encoding dimension and a time dimension. Each of the plurality of blocks may be associated with one portion of the plurality of phase encoding gradient field values. Each of one portion of the plurality of phase encoding gradient field values may correspond to one single sampling point denoting a k-space line. The method may also include obtaining k-space data associated with the image sequence using the sampling pattern. In some embodiments, the method may include reconstructing the image sequence based on the k-space data.

Accordingly, each of the plurality of phase encoding gradient field values associated with the image sequence may be not repeated to be applied for sampling MR signals during a time period. In other words, the sampling count corresponding to each of the plurality of phase encoding gradient field values applied for sampling MR signals may be uniform which may improve sampling efficiency.

Figure 1:
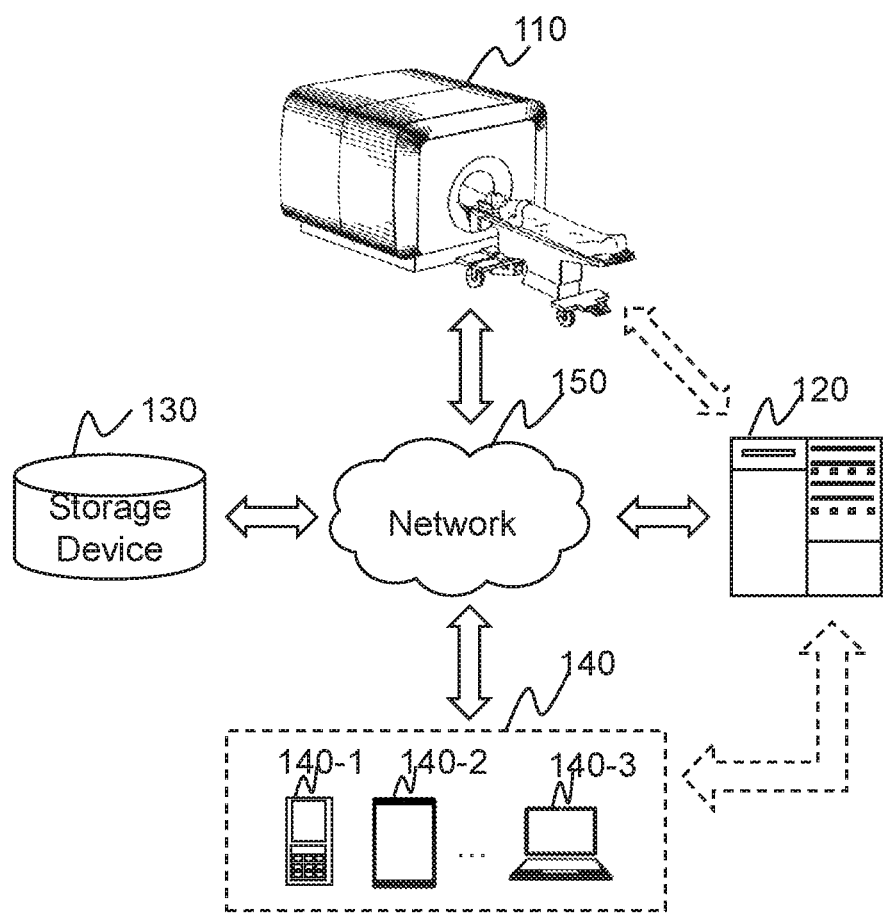
FIG. 1 is a schematic diagram illustrating an exemplary MRI system according to some embodiments of the present disclosure.

FIG. 1 is a schematic diagram illustrating an exemplary MRI system 100 (also referred to as imaging system 100 herein) according to some embodiments of the present disclosure. As illustrated, the MRI system 100 may include an MR scanner (or referred to as an MRI scanner) 110, a processing device 120, a storage device 130, one or more terminals 140, and a network 150. The components in the MRI system 100 may be connected in one or more of various ways. Merely by way of example, as illustrated in FIG. 1, the MR scanner 110 may be connected to the processing device 120 through the network 150. As another example, the MR scanner 110 may be connected with the processing device 120 directly as indicated by the bi-directional arrow in dotted lines linking the MR scanner 110 and the processing device 120. As a further example, the storage device 130 may be connected with the processing device 120 directly (not shown in FIG. 1) or through the network 150. As still a further example, one or more terminal(s) 140 may be connected with the processing device 120 directly (as indicated by the bi-directional arrow in dotted lines linking the terminal(s) 140 and the processing device 120) or through the network 150.

The MR scanner 110 may scan a subject or a portion thereof that is located within its detection region and generate MR signals relating to the (part of) subject. In the present disclosure, the terms "subject" and "object" are used interchangeably. In some embodiments, the subject may include a body, a substance, or the like, or a combination thereof. In some embodiments, the subject may include a specific portion of a body, such as the head, the thorax, the abdomen, or the like, or a combination thereof. In some embodiments, the subject may include a specific organ, such as the heart, the esophagus, the trachea, the bronchus, the stomach, the gallbladder, the small intestine, the colon, the bladder, the ureter, the uterus, the fallopian tube, etc. The MR scanner 110 may include a magnet assembly, a gradient coil assembly, and a radiofrequency (RF) coil assembly.

The magnet assembly may generate a first magnetic field (also referred to as a main magnetic field) for polarizing the subject to be scanned. The magnet assembly may include a permanent magnet, a superconducting electromagnet, a resistive electromagnet, etc.

The gradient coil assembly may generate a second magnetic field. The gradient coil assembly may include X-gradient coils, Y-gradient coils, and Z-gradient coils. The gradient coil assembly may be powered on by applying one or more pulses to generate second magnetic fields in the X direction, the Y direction, and the Z direction, respectively. The main magnetic field may superpose with the second magnetic field gradients with from gradient magnetic fields in the X direction (Gx), the Y direction (Gy), and the Z direction (Gz) respectively to encode the spatial information of the subject. In some embodiments, the X direction may be designated as a frequency encoding direction, while the Y direction may be designated as a phase encoding direction-phase encoding dimension. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated according to one or more pulse sequences. The MR signals may also be referred to as echo signals. Further, the MR signals may be processed to fill a k-space to obtain the k-space data based on a sampling technique. Exemplary sampling techniques may include a Cartesian sampling technique, a spiral sampling technique, a radial sampling technique, a Z-sampling technique, an undersampling technique, etc. The k-space may include a two-dimension (2D) k-space, a three-dimension (3D) k-space, etc. The RF receiver coils may acquire MR signals from the subject according to the one or more pulse sequences. A pulse sequence may be defined by imaging parameters and arrangement associated with the image parameters in time sequence. In some embodiments, the imaging parameters may include parameters relating to an RF pulse (e.g., the number of excitations (NEX), a bandwidth, etc.) emitted by the RF coil, parameters relating to gradient fields generated by the gradients coil (e.g., a gradient direction, a time for applying a gradient field, an intensity for applying a gradient gradient, a duration for applying a gradient, etc.), and parameters relating to MR signals (e.g., an echo time (TE), an echo train length (ETL), a spin echo type, the number of phases), etc. Exemplary pulse sequences may include a spin echo sequence, a gradient echo sequence, a diffusion sequence, an inversion recovery sequence, or the like, or a combination thereof. For example, the spin echo sequence may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or a combination thereof.

A pulse sequence may be set by a user or a default setting of the MRI system 100. For example, the gradient echo sequence (e.g., a T1WI gradient echo sequence) may be applied for a heart scan. In some embodiments, at least one portion of a pulse sequence may be designed based on a sampling pattern. For example, the parameters relating to gradient fields of a pulse sequence (e.g., a time for applying a phase encoding gradient field, an intensity for applying a phase encoding gradient field, a duration for applying a phase encoding gradient gradient field, etc.,) may be determined based on the sampling pattern. The sampling pattern may include a plurality of sampling points associated with a plurality of phase encoding gradient field values. Each of the plurality of phase encoding gradient field values corresponding to one single sampling point during a time period. Each of the plurality of sampling points may be defined by a phase encoding gradient field value and a time value. A time for applying a phase encoding gradient field and/or an intensity for applying a phase encoding gradient field may be determined according to a phase encoding gradient field value and a time value associated with a sampling point in the sampling pattern. In some embodiments, the sampling pattern may include a plurality of blocks arranged in a two-dimensional space defined by a phase encoding dimension (i.e., phase encoding directionphase encoding dimension) and a time dimension (i.e., time direction time dimension). Each of the plurality of blocks may be associated with one portion of the plurality of phase encoding gradient field values. Each of one portion of the plurality of phase encoding gradient field values may correspond to one single sampling point denoting a k-space line (i.e., readout line). More descriptions for the sampling pattern may be found elsewhere in the present disclosure (e.g., FIGS. 5-8, and the descriptions thereof).

In some embodiments, the MR scanner 110 may include an analog-to-digital converter (ADC) (not shown in FIG. 1). The analog-to-digital converter may convert MR signals received by one or more RF receiver coils into MR image data. The analog-to-digital converter may be a direct-conversion ADC, a successive-approximation ADC, a rampcompare ADC, a Wilkinson ADC, an integrating ADC, a delta-encoded ADC, a pipeline ADC, a sigma-delta ADC, or the like, or a combination thereof.

The processing device 120 may process data and/or information obtained from the MR scanner 110, the terminal(s) 140, and/or the storage device 130. For example, the processing device 120 may determine a sampling patter associated with an image sequence including a plurality of consecutive images (i.e., images). As another example, the processing device 120 may obtain k-space data associated with the image sequence using the sampling pattern. As still an example, the processing device 120 may reconstruct the image sequence based on the k-space data. In some embodiments, the reconstructed image may be transmitted to the terminal(s) 140 and displayed on one or more display devices in the terminal(s) 140. In some embodiments, the processing device 120 may be a single server or a server group. The server group may be centralized or distributed. In some embodiments, the processing device 120 may be local or remote. For example, the processing device 120 may access information and/or data stored in the MR scanner 110, the terminal(s) 140, and/or the storage device 130 via the network 150. As another example, the processing device 120 may be directly connected with the MR scanner 110, the terminal(s) 140, and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented on a computing device 200 having one or more components illustrated in FIG. 2 in the present disclosure.

The storage device 130 may store data and/or instructions. In some embodiments, the storage device 130 may store data obtained from the terminal(s) 140 and/or the processing device 120. For example, the storage device 130 may store MR signals obtained from the MR scanner 110 and k-space data associated with the MR signals. As another example, the storage device 130 may store a sampling pattern including different sampling trajectories. As still another example, the storage device 130 may store one or more MR image reconstruction algorithms as described elsewhere in the present disclosure. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected with the network 150 to communicate with one or more components of the MRI system 100 (e.g., the processing device 120, the terminal(s) 140, etc.). One or more components of the MRI system 100 may access the data or instructions stored in the storage device 130 via the network 150. In some embodiments, the storage device 130 may be directly connected with or communicate with one or more components of the MRI system 100 (e.g., the processing device 120, the terminal(s) 140, etc.). In some embodiments, the storage device 130 may be part of the processing device 120.

The terminal(s) 140 may include a mobile device 140-1, a tablet computer 140-2, a laptop computer 140-3, or the like, or any combination thereof. In some embodiments, the mobile device 140-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smartwatch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 140 may remotely operate the MR scanner 110. In some embodiments, the terminal(s) 140 may operate the MR scanner 110 via a wireless connection. In some embodiments, the terminal(s) 140 may receive information and/or instructions inputted by a user, and send the received information and/or instructions to the MR scanner 110 or the processing device 120 via the network 150. In some embodiments, the terminal(s) 140 may receive data and/or information from the processing device 120. In some embodiments, the terminal(s) 140 may be part of the processing device 120. In some embodiments, the terminal(s) 140 may be omitted.

In some embodiments, the terminal(s) 140 may send and/or receive information for MR image reconstruction to the processing device 120 via a user interface. The user interface may be in the form of an application for MR image reconstruction implemented on the terminal(s) 140. The user interface implemented on the terminal(s) 140 may be configured to facilitate communication between a user and the processing device 120. In some embodiments, a user may input a request for MR image reconstruction via the user interface implemented on a terminal 140. The terminal(s) 140 may send the request for MR image reconstruction to the processing device 120 for reconstructing an MR image sequence based on k-space data obtained based on sampling pattern as described elsewhere in the present disclosure (e.g., FIGS. 5-8 and the descriptions thereof). In some embodiments, the user may input and/or adjust parameters (e.g., the number or count of sampling points, the size, etc.) of the sampling pattern via the user interface. In some embodiments, the user interface may facilitate the presentation or display of information and/or data (e.g., a signal) relating to MR image reconstruction received from the processing device 120. For example, the information and/or data may include a result generated by the processing device 120 in an image reconstruction. For example, the result may include one or more images (e.g., 2D images, 3D images, etc.), one or more data figures, one or more words, one or more digits, one or more models for MR image reconstruction, parameters used in such image reconstruction, etc. In some embodiments, the information and/or data may be further configured to cause the terminal(s) 140 to display the result to the user.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, or the storage device 130) may communicate information and/or data with one or more other components of the MRI system 100 via the network 150. For example, the processing device 120 may obtain MR signals from the MR scanner 110 via the network 150. As another example, the processing device 120 may obtain user instructions from the terminal(s) 140 via the network 150. In some embodiments, the network 150 may be any type of wired or wireless network, or a combination thereof. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), an image relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, the storage device 130, etc.) may transmit or receive information and/or data with one or more other components of the MRI system 100 via the network 150. For example, the processing device 120 may obtain image data from the MR scanner 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), an image relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

FIG. 2 is a schematic diagram illustrating hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 120 in accordance with techniques described herein. The computer instructions may include, for example, routines, programs, objects, components, signals, data structures, procedures, modules, and functions, which perform particular functions described herein. For example, the processor 210 may process data obtained from the MR scanner 110, the terminal(s) 140, the storage device 130, and/or any other component of the imaging system 100. Specifically, the processor 210 may process one or more measured data sets obtained from the MR scanner 110. For example, the processor 210 may reconstruct an image based on the data set(s). In some embodiments, the reconstructed image may be stored in the storage device 130, the storage 220, etc. In some embodiments, the reconstructed image may be displayed on a display device by the I/O 230. In some embodiments, the processor 210 may perform instructions obtained from the terminal(s) 140. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the MR scanner 110, the terminal(s) 140, the storage device 130, or any other component of the imaging system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 120 for reducing or removing one or more artifacts in an image.

The I/O 230 may input or output signals, data, and/or information. In some embodiments, the I/O 230 may enable user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 150) to facilitate data communications. The communication port 240 may establish connections between the processing device 120 and the MR scanner 110, the terminal(s) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
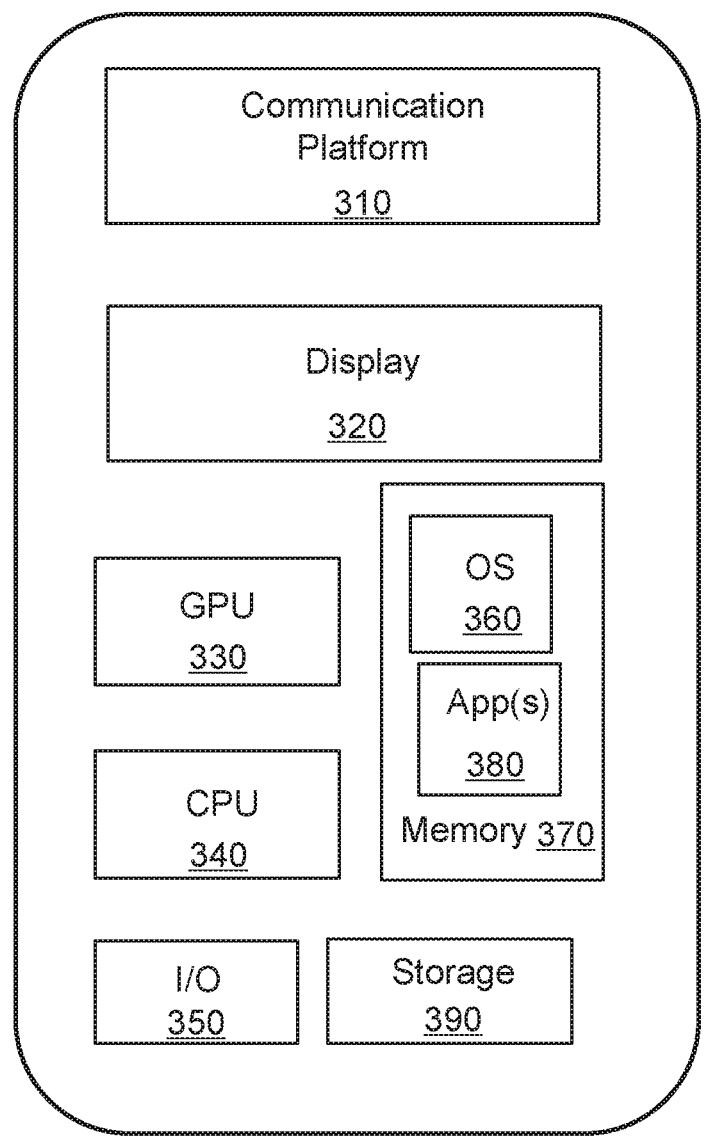
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device 300 according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the imaging system 100 via the network 150.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4:
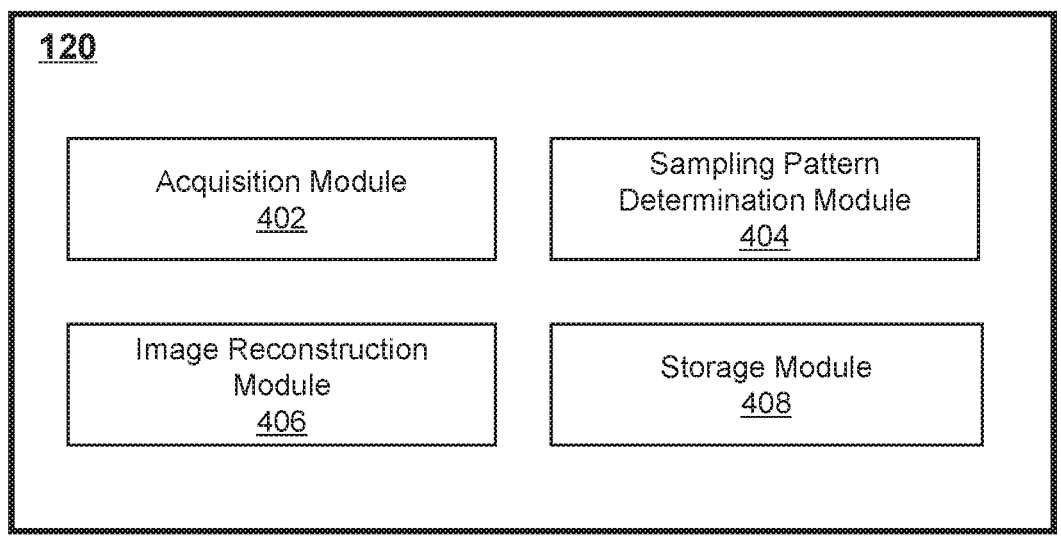
FIG. 4 is a block diagram illustrating an exemplary processing device 120 according to some embodiments of the present disclosure.

FIG. 4 is a block diagram illustrating an exemplary processing device according to some embodiments of the present disclosure. The processing device 120 may include an acquisition module 402, a sampling pattern determination module 404, an image reconstruction module 406, and a storage module 408. At least a portion of the processing device 120 may be implemented on a computing device as illustrated in FIG. 2 or a mobile device as illustrated in FIG. 3.

The acquisition module 402 may obtain data for MR image reconstruction. The data for MR image reconstruction may include image data, a sampling pattern, algorithms for MR image reconstruction, etc. For example, the acquisition module 402 may obtain the image data from the MRI system 100 and/or a storage device (e.g., the storage device 130, the storage 220, the storage 390). In some embodiments, the image data may include k-space data (e.g., k-space data associated with an image sequence, an image, etc. The k-space data may be associated with MR signals acquired by an MR scanner (e.g., the MR scanner 110) scanning a subject (e.g., a substance, an organ, a tissue, etc.). In some embodiments, the k-space data may be generated by filling a k-space using the MR signals. In some embodiments, the acquisition module 402 may send the image data to other modules and/or units of the processing device 120 for further processing. For example, the image data may be sent to the storage module 408 for storage. For another example, the acquisition module 402 may send the image data (e.g., the scanning data) to the image reconstruction module 406 for reconstructing an image.

The sampling pattern determination module 404 may be configured to determine a sampling pattern. The sampling pattern may be associated with an image sequence and a plurality of phase encoding gradient field values. When a specific phase encoding gradient field value is applied for collecting an MR signal based on the sampling pattern, the specific phase encoding gradient field value may be not applied for collecting MR signals during a period of time. For example, the sampling pattern determination module 404 may determine the sampling pattern based on a preliminary sampling pattern. The preliminary sampling pattern may be associated with the image sequence in a time dimension and the plurality of phase encoding gradient field values in a phase encoding dimension. The sampling pattern determination module 404 may classify the preliminary sampling pattern into one or more segments (e.g., a first segment, a second segment and a third segments) along the phase encoding dimension. The sampling pattern determination module 404 may classify each of the one or more segments into a plurality of blocks including a plurality of sampling points along the time dimension and the phase encoding dimension. Details (e.g., size of blocks, or locations of sampling points) of determining the sampling pattern may be found elsewhere in the present disclosure (e.g., FIG. 5-6 and the descriptions thereof).

The image reconstruction module 406 may reconstruct an image sequence. For example, the image reconstruction module 406 may reconstruct a plurality of images included in the image sequence based on the k-space data obtained by the acquisition module 402 by using an MR reconstruction technique as described elsewhere in the present disclosure. As another example, the image reconstruction module 406 may determine a reference readout line may by weighting and/or averaging the k-space data along the time dimension. The reference readout line may be used for reference by the image reconstruction module 406 to reconstruct the image sequence.

The storage module 408 may store information. The information may include programs, software, image reconstruction algorithms, image data, control parameters, processed image data, or the like, or a combination thereof. For example, the information may include block data (e.g., size of a block, locations of sampling points on the block), sampling patter data (e.g., a count or number of blocks of a sampling pattern, a plurality of sampling trajectories in the sampling pattern), k-space data, image sequences, reconstructed images, etc. In some embodiments, the storage module 408 may store one or more programs and/or instructions that may be executed by the processor(s) of the processing device 120 to perform exemplary methods described in this disclosure. For example, the storage module 408 may store program(s) and/or instruction(s) that can be executed by the processor(s) of the processing device 120 to determine one or more blocks, determine a sampling pattern, acquire image data, and/or reconstruct an image based on the image data.

In some embodiments, one or more modules illustrated in FIG. 4 may be implemented in at least part of the exemplary MRI system 100 as illustrated in FIG. 1. For example, the acquisition module 402, the storage module 408, the sampling pattern determination module 404, and/or the image reconstruction module 406 may be integrated into a console (not shown). Via the console, a user may set parameters for determining a sampling pattern, controlling imaging processes, controlling parameters for reconstruction of an image, viewing reconstructed images, etc. In some embodiments, the console may be implemented via the processing device 120 and/or the terminals 140. In some embodiments, the sampling pattern determination module 404 may be integrated into the terminals 140.

In some embodiments, the processing device 120 may not include the sampling pattern determination module 404. One or more sampling patterns determined by another device may be stored in the MRI system 100 (e.g., the storage device 130, the storage 220, the storage 390, the memory 360, the storage module 408, etc.) or in an external device accessible by the processing device 120 via, for example, the network 150. In some embodiments, such a device may include a portion the same as or similar to the sampling pattern determination module 404. In some embodiments, the sampling pattern determination module 404 may store one or more blocks determined by another device and be accessible by one or more components of the MRI system 100 (e.g., the image reconstruction module 406, etc.). In some embodiments, a sampling pattern applicable in the present disclosure may be determined by the MRI system 100 (or a portion thereof including, e.g., the processing device 120) or an external device accessible by the MRI system 100 (or a portion thereof including, e.g., the processing device 120) following the processes disclosure herein.

Figure 5:
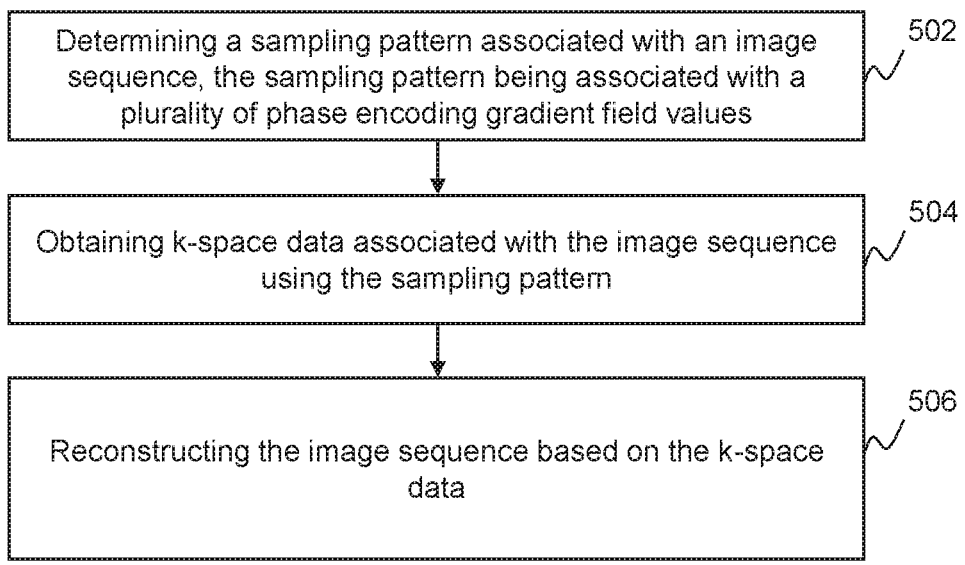
FIG. 5 is a flowchart illustrating an exemplary process for reconstructing an image sequence according to some embodiments of the present disclosure.

FIG. 5 is a flowchart illustrating an exemplary process for reconstructing an image sequence according to some embodiments of the present disclosure. In some embodiments, one or more operations of process 500 illustrated in FIG. 5 may be implemented in the MRI system 100 illustrated in FIG. 1. For example, process 500 illustrated in FIG. 5 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 502, a sampling pattern associated with an image sequence may be determined. Operation 502 may be performed by the sampling pattern determination module 404. The image sequence may include a plurality of consecutive images (also referred to as images) during a time period (e.g., 0.8 s, 0.9 s, 1 s, etc.), such as one or more cardiac cycles. Each of the plurality of consecutive images may correspond to a sub-time period (e.g., 40 ms, 50 ms, etc.) of the time period. The number or count of the plurality of images in the image sequence may be set by a user or according to a default setting of the MRI system 100. For example, the number or count of the plurality of images in the image sequence may be 12, 16, 20, 24, 36, 48, etc. Each of the plurality of consecutive images may have a same size. As used herein, the size of an image may be defined by the number or count of pixels or voxels in the image. For example, an image may be denoted by a matrix including a plurality of elements (i.e., pixels or voxels). The size of an image may be denoted as a size of the matrix, such as 256×256, 144×144, etc.

The sampling pattern may be used to acquire encoded MR signals associated with k-space data for reconstructing the plurality of consecutive images. The MR signals may be encoded by a plurality of phase encoding gradient fields during a scan. The sampling pattern may be associated with intensities of the plurality of phase encoding gradient fields (i.e., phase encoding gradient field values) and arrangements thereof in time sequence. Further, the sampling pattern may be configured to determine intensities of phase encoding gradient fields and when the phase encoding gradient fields need to be applied for encoding MR signals associated with k-space corresponding to the plurality of consecutive images in the image sequence.

In some embodiments, the sampling pattern may have a vertical axis denoting a phase encoding dimension, and a horizontal axis denoting a time dimension. The time dimension may correspond to the plurality of consecutive images in the image sequence. Each of the plurality of consecutive images in the image sequence may correspond to a specific sub-time period (e.g., 50 ms, 40 ms, etc.) which means each of the plurality of consecutive images may be reconstructed based on MR signals acquired during the specific sub-time period. The phase encoding dimension may correspond to the plurality of phase encoding gradient field values. Each phase encoding gradient field value may define an intensity and a direction of a phase encoding gradient field. The plurality of phase encoding gradient field values may be arranged symmetrically along the phase encoding dimension. For example, the plurality of phase encoding gradient field values may be arranged symmetrically from +128 to −128 along the phase encoding dimension. As a further example, a phase encoding gradient field value of +128 may have the same intensity and an opposite direction of a phase encoding gradient field value of −128. The phase encoding gradient field value of −128 may be designated to be smaller than the phase encoding gradient field value of +128. The total number of the plurality of phase encoding gradient field values may relate to a size of each image in the image sequence. Taking the image size of 256×256 as an example, there may be 256 phase encoding gradient field values associated with the sampling pattern. The phase encoding gradient field values may range from −128 to +128. Taking the image size of 128×128 as an example, there may be 128 phase encoding gradient field values associated with the sampling pattern. The phase encoding gradient field values may range from −64 to +64.

Figure 8:
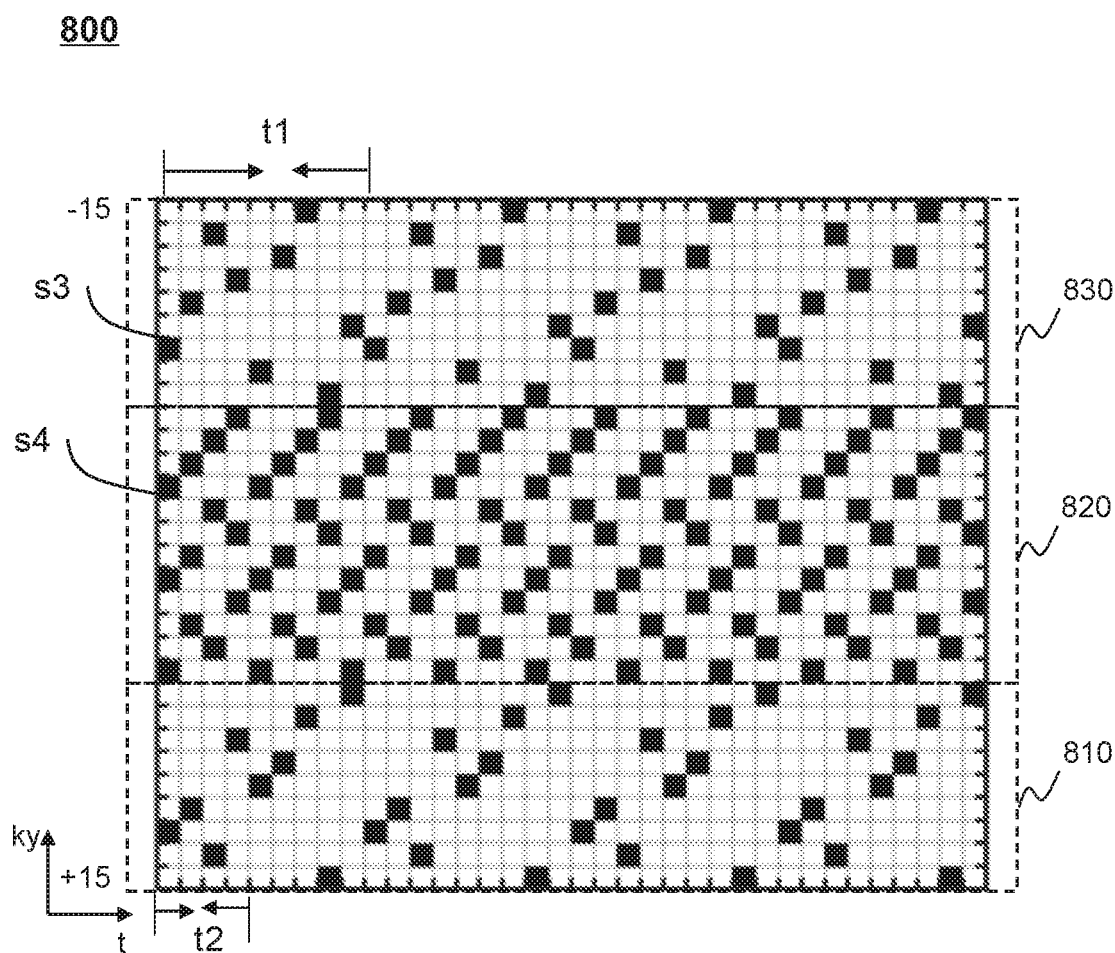
FIG. 8 is a schematic diagram illustrating an exemplary sampling pattern according to some embodiments of the present disclosure.

For brevity, the sampling pattern may be denoted as a two-dimensional grid (2D grid) which may be described by a Cartesian coordinate. The vertical axis of the 2D grid may refer to the phase encoding dimension (e.g., ky direction as shown in FIG. 8), and the horizontal axis may refer to the time dimension (e.g., t direction as shown in FIG. 8). The 2D grid may also be referred to as a k-t grid. The k-t grid may include a plurality of columns of cells (or points) arranged along the time dimension. Each column of the plurality of columns of cells may correspond to one image. The k-t grid may include a plurality of rows of cells arranged along the phase encoding dimension. Each row of the plurality of rows of cells may correspond to a phase encoding gradient field value.

The sampling pattern may be pseudo-random in a k-space direction (also referred to as a readout direction). The sampling pattern may include a plurality of sampling points. A sampling point herein may represent a readout line (also referred to as a readout line or k-space line) at a specific phase encoding gradient field value along an orthogonal direction (not shown) of the phase encoding dimension and the time dimension. A position of each of the plurality of sampling points (i.e., k-space lines) in the sampling pattern may be defined by a phase encoding gradient field value and a specific image in the image sequence or a specific sub-time period associated with the specific image. The position of each of the plurality of sampling points in the sampling pattern may satisfy a criterion. The criterion may be that each of the plurality of phase encoding gradient field values associated with the sampling pattern corresponds to one single point during several sub-time periods. In other words, at least one segment of the sampling pattern may not repeat itself during the several sub-time periods. Each of the several sub-time periods may be associated with several consecutive images. In other words, a k-space line in a k-space associated with a phase encoding gradient field value may be sampled only once during a time period (e.g., the several sub-time periods), and is not sampled repeatedly during the time period (e.g., the several sub-time periods). For example, as shown in FIG. 8, a phase encoding gradient field value associated with sampling point S3 corresponds to just one single sampling point S3 during time period t1, and the time period t1 includes 9 sub-time periods associated with 9 images. Each of the plurality of consecutive images in the image sequence may correspond to one or more sampling points corresponding to different phase encoding gradient field values. In some embodiments, the number or count of sampling points associated with each of the plurality of consecutive images may be same or different Each of the plurality of phase encoding gradient field values associated with the image sequence may correspond to one or more sampling points. The number or count of sampling points corresponding to each of the plurality of phase encoding gradient field values may be same or different. For example, a phase encoding gradient field value corresponding to a center region of the sampling pattern may correspond to more sampling points than edge regions of the sampling pattern. In other words, the sampling density in the center region of the sampling pattern may be greater than that in the edge regions of the sampling pattern. As used herein, the sampling density of a region in the sampling pattern refers to the count of sampling points in a unit area of the region. In other words, different phase encoding gradient field values corresponding to one single sampling point may be during a same time period or different time periods. For example, as shown in FIG. 8, a phase encoding gradient field value associated with sampling point S3 corresponds to one single sampling point S3 during time period t1, and the time period t1 includes 9 sub-time periods associated with 9 images. A phase encoding gradient field value associated with sampling point S4 corresponds to one single sampling point S4 during time period t2, and the time period t2 includes 4 sub-time periods associated with 4 images. In some embodiments, locations of the plurality of sampling points on the sampling pattern may be arranged periodically along the time dimension associated with the sampling pattern. Locations of sampling points along the phase encoding dimension in two cycles may be the same. In other words, phase encoding gradient field values of two corresponding sampling points in two cycles may be the same. One cycle may be associated with several images in the image sequence, for example, 4 images, 6 images, 8 images, etc.

In some embodiments, the sampling pattern may include a plurality of blocks. The plurality of blocks may be arranged in a two-dimensional space defined by the phase encoding dimension and the time dimension. Each of the plurality of blocks may include a pre-determined number of sampling points associated with a time period and one portion of the plurality of phase encoding gradient field values associated with the image sequence. For example, if the plurality of phase encoding gradient field values associated with the image sequence range from −128 to +128, a block may be associated with the one portion of the plurality of phase encoding gradient field values ranging from +128 to +120, +128 to +120, −128 to −120, etc. A time period associated with a block may be classified into multiple sub-time periods. Positions of sampling points in a block may need to satisfy the criterion. The criterion may be that each of phase encoding gradient field values associated with a block may correspond to one single sampling point and each of the multiple sub-time periods associated with the block may correspond to one single sampling point. In other words, a block herein may be denoted as a square array including a plurality of points (or squares) arranged in a plurality of columns and rows. One single point in each of the plurality of columns of the block may be determined as a sampling point. One single point in each of the plurality of rows of the block may be determined as a sampling point. Sampling points in each of the plurality of columns of the block may be located in different rows of the block. In other words, the sampling points in the block may occupy different columns and different rows. For example, if a position of each of the sampling points in the block is denoted by coordinates including a horizontal coordinate (e.g., a phase encoding gradient value) and a vertical coordinate (e.g., a time value or a sequence number of an image), horizontal coordinates of each of the sampling points are different and the vertical coordinates of each of the sampling points are different. Accordingly, when a specific phase encoding gradient field value is applied for collecting an MR signal, the specific phase encoding gradient field value may be not applied for collecting MR signals during a time period (e.g., such as 200 ms, 300 ms, 400 ms, etc.) associated with a block. The sampling points in a block may be determined by a user or according to a default setting of the MRI system 100. For example, the user may select the sampling points from the block manually. As another example, the processing device 120 may select the sampling points from the block randomly.

Figure 7:
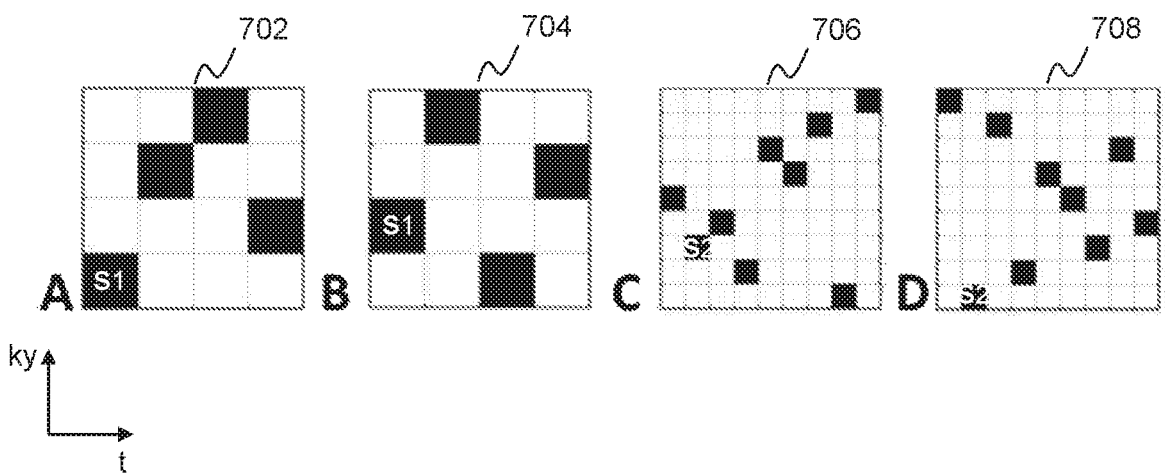
FIG. 7 is a schematic diagram illustrating exemplary blocks according to some embodiments of the present disclosure.

A block may have a size N×M, (e.g., 4×4, 6×6, 9×9, etc.) denoted by a square array including a plurality of points. N may refer to a count of rows in the block relating to phase encoding gradient field values. M may refer to a count of columns in the block relating to a time period associated the block. The size of a block may be defined by the count of the plurality of points in the block. For example, a block with size of 4×4 (also referred to as a 4×4 block, e.g., a block 702 (A) or a block 704 (B) as shown in FIG. 7) may include 16 points. A block with size of 9×9 (also referred to as a 9×9 block, e.g., a block 706 (C) or a block 708 (D) as shown in FIG. 7) may include 81 points. Different sizes of the block may be associated with different counts (numbers) of phase encoding gradient field values, include different counts (numbers) of the plurality of points, and/or different counts (numbers) of sampling points in the different blocks. For example, a 4×4 block (e.g., a block 702 (A) or a block 704 (B) as shown in FIG. 7) may be associated with 4 phase encoding gradient field values, include 16 points and 4 sampling points. As another example, a 9×9 block (e.g., a block 706 (C) or a block 708 (D) as shown in FIG. 7) may be associated with 9 phase encoding gradient field values, include 81 points and 9 sampling points.

In some embodiments, the plurality of blocks included in the sampling pattern may include a same size. For the plurality of blocks with the same size, a count (number) of the plurality of points and the sampling points in each of the plurality of blocks may be the same. The count (number) of sampling points correspond to each of the plurality of phase encoding gradient field values associated with the sampling pattern may be the same. In some embodiments, blocks in different regions of the sampling pattern may have different sizes. For example, blocks in a center region of the sampling pattern may have a smaller size than edge regions of the sampling pattern. In other words, a count of sampling points in the edge regions of the sampling pattern is smaller than a count of sampling points corresponding to the center region of the sampling pattern. Accordingly, the sampling density in the center region of the sampling pattern may be greater than that in the edge regions of the sampling pattern.

In some embodiments, locations of sampling points on two or more blocks with the same size may be the same or different. As used herein, a location of a sampling point on a block may be defined by a column and a row of the block. For example, a sampling point located on a first column of a first block may be located on a first row of the first block. A sampling point located on a first column of the second block may be located on a first row of the second block. It means that locations of the two sampling points on the first block and the second block are the same. As another example, a sampling point located on a first column of a first block may be located on a first row of the first block. A sampling point located on a first row of a second block may be located on a second row of the second block. It means that locations of the two sampling points on the first block and the second block are different.

The count (number) of the plurality of blocks included in the sampling pattern may be set by a user or according to a default setting of the MRI system 100. For example, the count (number) of the plurality of blocks may be determined based on the count (number) of the plurality of consecutive images included in the image sequence, the range of the plurality of phase encoding gradient field values, and the size of each of the plurality of blocks. Taking the count of the plurality of images of P and the plurality of phase encoding gradient field values ranging in [−F,+F] as an example, if the plurality of blocks include the same size of A×A, the count of the plurality of blocks (also referred to as N) may equal to 2F×P/A^2.

In some embodiments, the sampling pattern associated with the image sequence may include one or more segments, for example, a first segment, a second segment, and a third segment, etc. The first segment may refer to a lower edge region of the sampling pattern. The second segment may refer to a center region of the sampling pattern. The third segment may refer to an upper edge region of the sampling pattern. Phase encoding gradient field values associated with the second segment may be smaller than that associated with the first segment and greater than that associated with the third segment. For example, if the plurality of phase encoding gradient field values associated with the image sequence range from −128 to +128, phase encoding gradient field values associated with the first segment may range from +128 to +110, phase encoding gradient field values associated with the second segment may range from +110 to −110, and phase encoding gradient field values associated with the third segment may range from −128 to −110. The first segment, the second segment and the third segment may include different sampling densities (i.e., different counts of sampling points) or a same sampling density. For example, the sampling density in the first segment and the sampling density in the third segment may be smaller than the sampling density in the second segment. In other words, a count of sampling points in the first segment and the third segment may be smaller than a count of sampling points corresponding to the second segment.

Each of the first segment, the second segment, and the third segment may include one portion of the plurality of blocks arranged along the time dimension, also referred to as a first portion of blocks, a second portion of blocks and a third portion of blocks, respectively. The sampling density of each of the first segment, the second segment, and the third segment may be determined by the size of blocks in different segments. The greater the size of blocks in a segment is, the more sampling points in the segment may be, and the larger sampling density of the segment may be. Thus, if the sampling density in the first segment and the sampling density in the third segment are smaller than the sampling density in the second segment, each block of the first portion of blocks and each block of the third portion of blocks may have a smaller size (or include more points) than that of each block of the second portion of blocks. For example, each block of the second portion of blocks may be a 4×4 block, and each block of the first portion of blocks and each block of the third portion of blocks may be a 9×9 block (as shown in FIG. 8). A size of 4×4 block is smaller than a size of 9×9 block. The count of sampling points in 4×4 block is 4, and the count of sampling points in 9×9 block is 9. The sampling density in a segment with multiple 4×4 blocks are greater than the sampling density in a segment with multiple 9×9 blocks. In some embodiments, the size (or points) of each block of the first portion of blocks may be different from that of each block of the third portion of blocks. For example, each block of the first portion of blocks may be a 4×4 block, each block of the third portion of blocks may be a 6×6 block, and each block of the third portion of blocks may be a 9×9 block. In some embodiments, the sampling density in different regions of the first segment, the second segment, and/or the third segment may be different. For example, the first portion of blocks, the second portion of blocks, and/or the third portion of blocks may include different sizes of blocks. For example, the first segment may include the first portion of blocks including 4×4 blocks and 6×6 blocks. A region in the first segment with 4×4 blocks may have a greater sampling density than a region in the first segment with 6×6 blocks. As another example, the second segment may include the second portion of blocks including 3×3 blocks and 2×2 blocks. A region in the second segment with 3×3 blocks may have a smaller sampling density than a region in the second segment with 2×2 blocks.

In some embodiments, the sampling pattern may be determined based on a preliminary sampling pattern associated with the image sequence. The preliminary sampling pattern may be defined by a phase encoding dimension and a time dimension similar with the description of the sampling pattern elsewhere of the present disclosure. The sampling pattern determination module 404 may classify the preliminary sampling pattern into one or more segments (e.g., the first segment, the second segment and the third segments) along the phase encoding dimension. The sampling pattern determination module 404 may classify each of the one or more segments into a plurality of blocks along the time dimension. Each of the plurality of blocks may be associated with a plurality of phase encoding gradient field values. A plurality of sampling points may be determined for each of the plurality of blocks in each of the one or more segments. Each of the plurality of phase encoding gradient field values may correspond to one single sampling point denoting a k-space line. A target sampling pattern may be determined including the plurality of sampling points in the each of the plurality of blocks for each of the one or more segments. Details (e.g., size, or locations of sampling points) of determining the sampling pattern may be found elsewhere in the present disclosure (e.g., FIG. 6 and the descriptions thereof).

In 504, k-space data associated with the image sequence using the sampling pattern may be obtained. Operation 504 may be performed by the acquisition module 402. The k-space data may include a plurality of sub k-space data arranged in time sequence corresponding to the plurality of images included in the image sequence. In some embodiments, the sub k-space data associated with each of the plurality of images the image sequence may be determined by filling a k-space with MR signals associated with each of the plurality of consecutive images along a plurality of readout lines. Each of the plurality readout lines may be sampled or filled just only once during a time period (e.g., the several sub-time periods).

In some embodiments, MR signals associated with a specific image in the image sequence (or sub k-space data) may be acquired based on sampling points in the sampling pattern corresponding to the specific image. For example, the MR signals associated with the specific image may be acquired by applying specific phase encoding gradient field values at specific time values according to the sampling points in the sampling pattern. In some embodiments, the MR signals associated with the specific image in the image sequence may be collected by an MR scanner (e.g., the MR scanner 110) according to one or more pulse sequences. The one or more pulse sequences may be designed based on the sampling pattern. For example, the sampling pattern may be stored as a lookup table including a plurality of phase encoding gradient field values and arrangement thereof in time sequence. A time for applying a phase encoding gradient field and/or an intensity for applying a phase encoding gradient field may be determined according to the lookup table.

In some embodiments, the arrangement of the plurality of phase encoding gradient field values in time sequence may be determined by identifying a plurality of sampling trajectories corresponding to the plurality of consecutive images in the image sequence from the sampling pattern. Each of the plurality of sampling trajectories may correspond to one of the plurality of consecutive images. The lookup table may denote the plurality of sampling trajectories corresponding to the plurality of consecutive images. A sampling trajectory may be defined by one or more sampling points corresponding to an image arranged in time sequence, also referred as a direction of the sampling trajectory. A direction of a sampling trajectory may be defined by a change of phase encoding gradient field values corresponding to the one or more sampling points. For example, the phase encoding gradient field values corresponding to the plurality of sampling points on at least one of the plurality of sampling trajectories may vary in a descending order (i.e., descending direction) or an ascending order (i.e., ascending direction). Taking the ascending order as an example, a phase encoding gradient field value corresponding to a first sampling point on a sampling trajectory may be smaller than a phase encoding gradient field value corresponding to a second sampling point on the sampling trajectory. The second sampling point and the first sampling point may be two consecutive sampling points on the sampling trajectory. Directions of sampling trajectories with respect to two neighboring images in the sampling pattern may be the same or different. Taking different directions of sampling trajectories with respect to two neighboring images (e.g., a first image, a second image) as an example, if the sampling trajectory with respect to the first image includes a descending direction, the sampling trajectory with respect to the second image may include an ascending direction. The sampling trajectories with respect to two neighboring images may share a sampling point at a phase coding gradient field value. For example, when the directions of sampling trajectories with respect to two neighboring images in the sampling pattern are inverse, the sampling trajectories with respect to two neighboring images may share a sampling point at a maximum or minimum phase coding gradient field value associated with the two neighboring images. As a further example, if the sampling trajectory with respect to the first image includes a descending direction and the sampling trajectory with respect to the second image s includes an ascending direction, the sampling trajectories with respect to the first image and the second image may share a sampling point at the minimum phase encoding gradient field value associated with the sampling trajectory with respect to the first image or the second image. If the sampling trajectory with respect to the first image includes an ascending direction and the sampling trajectory with respect to the second image may include a descending direction, the sampling trajectories with respect to the first image and the second image may share a sampling point at the maximum phase encoding gradient field value associated with the sampling trajectory with respect to the first image or the second image.

In 506, the image sequence may be reconstructed based on the k-space data. Operation 506 may be performed by the image reconstruction module 406. In some embodiments, the k-space data may include a plurality of sub k-space data arranged in time sequence corresponding to the plurality of images included in the image sequence. Each of the plurality of images may be reconstructed based on corresponding sub k-space data using an MR image reconstruction technique. Exemplary MR image reconstruction techniques may include a 2-dimensional Fourier transform technique, a back projection technique (e.g., a convolution back projection technique, a filtered back projection technique), an iteration reconstruction technique, etc. Exemplary iteration reconstruction techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof. In some embodiments, a reference readout line may be determined by weighting and/or averaging the sub k-space data corresponding to k-space lines associated with each of the plurality of consecutive images along the time dimension. The reference readout line may correspond to reference k-space data that may be used for reconstructing a reference image based on an MR image reconstruction technique. The plurality of consecutive images may be reconstructed based on the reference image using, for example an iteration reconstruction technique.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 6:
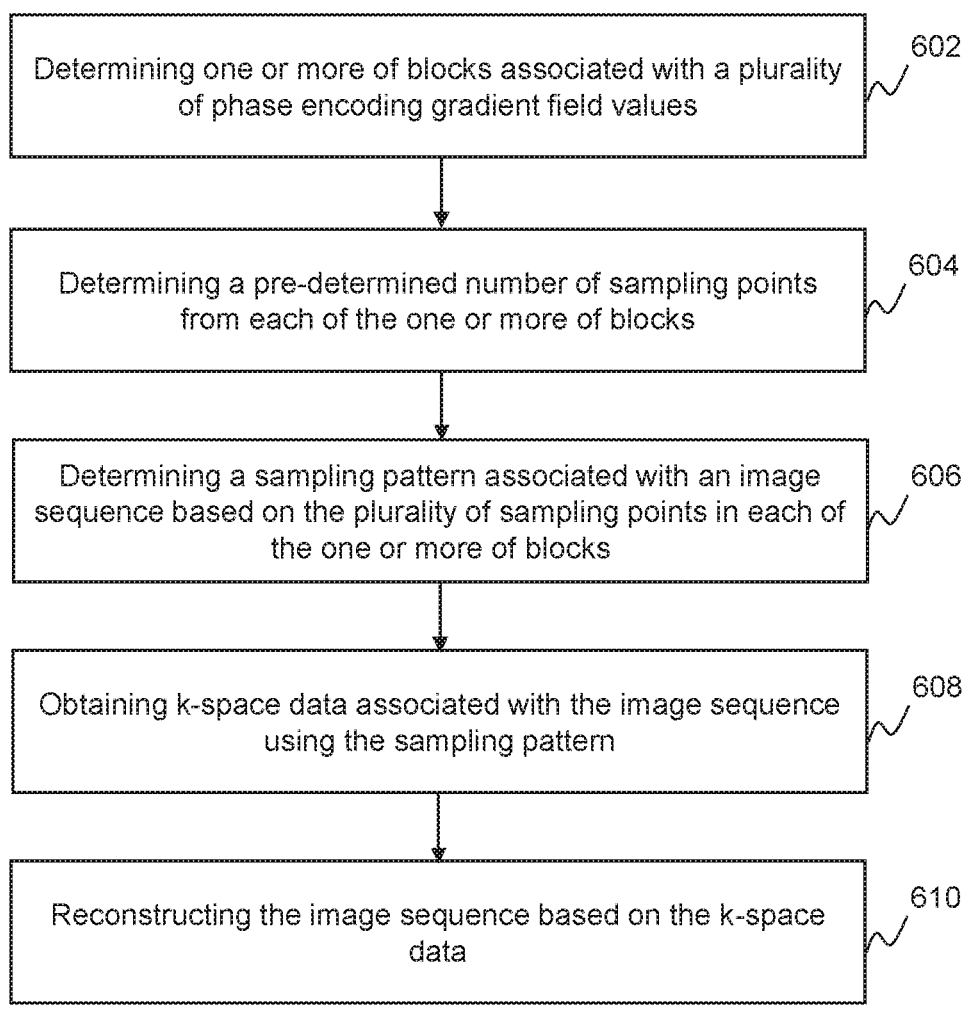
FIG. 6 is a flowchart illustrates an exemplary process for reconstructing an image sequence according to a sampling pattern according to some embodiments of the present disclosure.

FIG. 6 is a flowchart illustrates an exemplary process for reconstructing an image sequence according to a sampling pattern according to some embodiments of the present disclosure. In some embodiments, one or more operations of process 600 illustrated in FIG. 6 may be implemented in the MRI system 100 illustrated in FIG. 1. For example, process 600 illustrated in FIG. 6 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 602, one or more blocks associated with a plurality of phase encoding gradient field values may be determined. Operation 602 may be performed by the sampling pattern determination module 404. A block may have a size N×M. N may refer to a count of rows in the block. Each of the rows in the block may correspond to a phase encoding gradient field value. M may refer to a count of columns in the block. Each of the columns in the block may correspond to an image in an image sequence as described elsewhere in the present disclosure (e.g., FIG. 5 and the descriptions thereof). In some embodiments, N may be equal to M. For example, the one or more blocks may include a 4×4 block, 6×6 block, 9×9 block, etc. The size of a block may be defined by the number or count of the plurality of points in the block. For example, a block with size of 4×4 (also referred to as a 4×4 block, e.g., a block 702 (A) or a block 704 (B) as shown in FIG. 7) may include 16 points. A block with size of 9×9 (also referred to as a 9×9 block, e.g., a block 706 (C) or a block 708 (D) as shown in FIG. 7) may have 81 points. Different sizes of the block may be associated with different counts (numbers) of phase encoding gradient field values, and include different counts (numbers) of the plurality of points. For example, a 4×4 block (e.g., a block 702 (A) or a block 704 (B) as shown in FIG. 7) may be associated with 4 phase encoding gradient field values, and include 16 points. As another example, a 9×9 block (e.g., a block 706 (C) or a block 708 (D) as shown in FIG. 7) may be associated with 9 phase encoding gradient field values, and include 81 points. More descriptions of the blocks may be found elsewhere in the present disclosure, e.g., FIG. 5 and the descriptions thereof.

In 604, a pre-determined number of sampling points may be determined from each of the one or more blocks. Operation 604 may be performed by the sampling pattern determination module 404.

In some embodiments, a number (count) of the one or more blocks may be arranged in a two-dimensional space defined by the phase encoding dimension and the time dimension. Each of the one or more blocks may include the pre-determined number of sampling points associated with a time period and one portion of a plurality of phase encoding gradient field values associated with an image sequence. For example, if the plurality of phase encoding gradient field values associated with the image sequence range from −128 to +128, a block may be associated with the one portion of the plurality of phase encoding gradient field values ranging from +128 to +120, +128 to +120, −128 to −120, etc. A time period associated with a block may be classified into multiple sub-time periods. Positions of sampling points in a block may need to satisfy the criterion. The criterion may be that each of phase encoding gradient field values associated with a block may correspond to one single sampling point and each of the multiple sub-time periods associated with the block may correspond to one single sampling point. In other words, a block herein may be denoted as a square array including a plurality of points (or squares) arranged in a plurality of columns and rows. One single point in each of the plurality of columns of the block may be determined as a sampling point. One single point in each of the plurality of rows of the block may be determined as a sampling point. Sampling points in each of the plurality of columns of the block may be located in different rows of the block. In other words, the sampling points in the block may occupy different columns and different rows. For example, if a position of each of the sampling points in the block is denoted by coordinates including a horizontal coordinate (e.g., a phase encoding gradient value) and a vertical coordinate (e.g., a time value or a sequence number of an image), horizontal coordinates of each of the sampling points are different and the vertical coordinates of each of the sampling points are different. Accordingly, when a specific phase encoding gradient field value is applied for collecting an MR signal, the specific phase encoding gradient field value may be not applied for collecting MR signals during a time period (e.g., such as 200 ms, 300 ms, 400 ms, etc.) associated with a block. The sampling points in a block may be determined by a user or according to a default setting of the MRI system 100. For example, the user may select the sampling points from the block manually. As another example, the processing device 120 may select the sampling points from the block randomly. The pre-determined number of sampling points on a block may relate to the size of the block. The greater the size of the block is, the greater the count of sampling points on the block may be. More descriptions of the sampling points may be found elsewhere in the present disclosure, e.g., operation 502 and the descriptions thereof.

In 606, a sampling pattern associated with an image sequence may be determined based on the plurality of sampling points in each of the one or more of blocks. Operation 606 may be performed by the sampling pattern determination module 404. The sampling pattern may have a vertical axis denoting a phase encoding dimension, and a horizontal axis denoting a time dimension. In some embodiments, the sampling pattern may be determined based on the one or more blocks with sampling points determined in operation 604. In some embodiments, the one or more blocks may have the same size. Locations of sampling points in the one or more blocks may be the same or different. The sampling pattern may be determined by combining a number or count of the one or more blocks with the same size (e.g., 4×4 block). For example, the number or count of the one or more blocks with the same size having sampling points may be arranged along the phase encoding dimension and the time dimension to form a sampling pattern. In some embodiments, the one or more blocks may have different sizes. For example, the one or more blocks may include a first block with a first size (e.g., 9×9 block), a second block with a second size (e.g., 4×4 block), and a third block with a third size (e.g., 9×9 block). The first size and/or the third size may be larger than the second size. A first count of first blocks may be arranged along the time dimension to form a first segment of the sampling pattern. A second count of second blocks may be arranged along the time dimension to form a second segment of the sampling pattern. A third count of third blocks may be arranged along the time dimension to form a third segment of the sampling pattern. Locations of sampling points on the first blocks, the second blocks, the third blocks may be the same or different In some embodiments, the count of blocks and arrangements of the blocks in the sampling pattern may depend on the count of the plurality of images in the image sequence and the size of each of the plurality of images. More descriptions of the sampling pattern may be found elsewhere in the present disclosure, e.g., operation 502 and the descriptions thereof.

In 608, k-space data associated with the image sequence using the sampling pattern may be obtained. Operation 608 may be performed by the acquisition module 402. Operation 608 may be the same as or similar with operation 504, and may not repeated here.

In 610, the image sequence may be reconstructed based on the k-space data. Operation 610 may be performed by the image reconstruction module 406. Operation 610 may be the same as or similar with operation 504, and may not repeated here.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 7 is a schematic diagram illustrating exemplary blocks according to some embodiments of the present disclosure. As shown in FIG. 7, a block 702 (also referred as block A), a block 704 (also referred as block B), a block 706 (also referred as block C, and a block 708 (also referred as block D) may be illustrated. Each of the blocks may include a plurality of points. Each of the plurality of points may correspond to a phase encoding gradient field value in a phase direction (i.e., ky direction as shown in FIG. 7) and a time or period in the time dimension (i.e., t direction as shown in FIG. 7). Each of the blocks may include a plurality of sampling points denoted by block spots in FIG. 7. Each specific phase encoding gradient field value associated with a block may correspond to one single sampling point and each time or period associated with the block may correspond to one single sampling point. In other words, there is no a sampling point in a block corresponding to the same ky value (i.e., phase encoding gradient field value) or the same t value (i.e., time period). Accordingly, a specific phase encoding gradient field value associated with a block may be not applied for collecting MR signals repeatedly during a time period (e.g., such as 200 ms, 300 ms, 400 ms, etc.) associated with the block.

Block A and block B have the same size, both being a 4×4 block including 16 points and 4 sampling points. Each of columns of Block A and Block B includes one single sampling point and each of rows of Block A and Block B includes one single sampling point. Sampling points in Block A or Block B are located on different columns and rows. In other words, each of the sampling points in Block A or Block B corresponds to different ky values and t values. Accordingly, a position of a k-space may be sampled just once during a time period associated with Block A or Block B. Locations of sampling points on block A and locations of sampling points on block B are different. For example, a sampling point s1 on block A is located on the first row and the first column. A sampling point s1 on block B is located on the second row and the first column.

Block C and block D have the same size, both being a 9×9 block including 81 points and 9 sampling points. Each of columns of Block C and Block D includes one single sampling point and each of rows of Block C and Block D includes one single sampling point. Sampling points in Block C or Block D are located on different columns and rows. In other words, each of the sampling points in Block C or Block D corresponds to different ky values and t values. Accordingly, a position of a k-space may be sampled just once during a time period associated with Block C or Block D. Locations of sampling points on block C and locations of sampling points on block D are different. For example, a sampling point s2 on block C is located on the third row and the second column. A sampling point s2 on block D is located on the first row and the second column.

FIG. 8 is a schematic diagram illustrating an exemplary sampling pattern according to some embodiments of the present disclosure. The horizontal axis refers a time dimension denoting consecutive images in an image sequence. The vertical axis refers a phase encoding dimension denoting phase encoding gradient field values. The sampling pattern 800 may be associated with an image sequence including 36 images with an image size of 30×30. The plurality of phase encoding gradient field values may range from −15 to +15.

It should be noted that the plurality of phase encoding gradient field values ranging from −15 to +15 may be one portion of phase encoding gradient field values associated with the image sequence.

As shown in FIG. 8, the sampling pattern 800 includes a first segment 810, a second segment 820, and a third segment 830. The first segment 810 and third segment 830 are filled by four 9×9 blocks respectively arranged along the time dimension. Locations of sampling points in the four 9×9 blocks in the first segment 810 are the same. Locations of sampling points in the four 9×9 blocks in the third segment 830 are the same. Locations of sampling points in a 9×9 block in the first segment 810 and locations of sampling points in a 9×9 blocks in the third segment 830 are different. The second segment 820 are filled by twenty-seven 4×4 blocks. The second segment 820 includes three parts. Each of the three parts includes nine 4×4 blocks arranged along the time dimension. Locations of sampling points on in each of the three parts of the second segment are different. Each of columns of blocks in each of the three parts of the second segment includes one single sampling point and each of rows of blocks in each of the three parts of the second segment includes one single sampling point. Sampling points in blocks in each of the three parts of the second segment are located on different columns and rows. In other words, each of the sampling points in blocks in each of the three parts of the second segment corresponds to different ky values and t values. Accordingly, a position of a k-space may be sampled just once during a time period associated with a block in each of the three parts of the second segment.

The sampling density corresponding to the first segment 810 and the third segment 830 are smaller than the sampling density correspond to the second segment 820 as blocks in the second segment has a greater size than blocks in the first segment and the third segment. Each of the 36 consecutive images corresponds to 5 sampling points denoting 5 readout lines.

Figure 9:
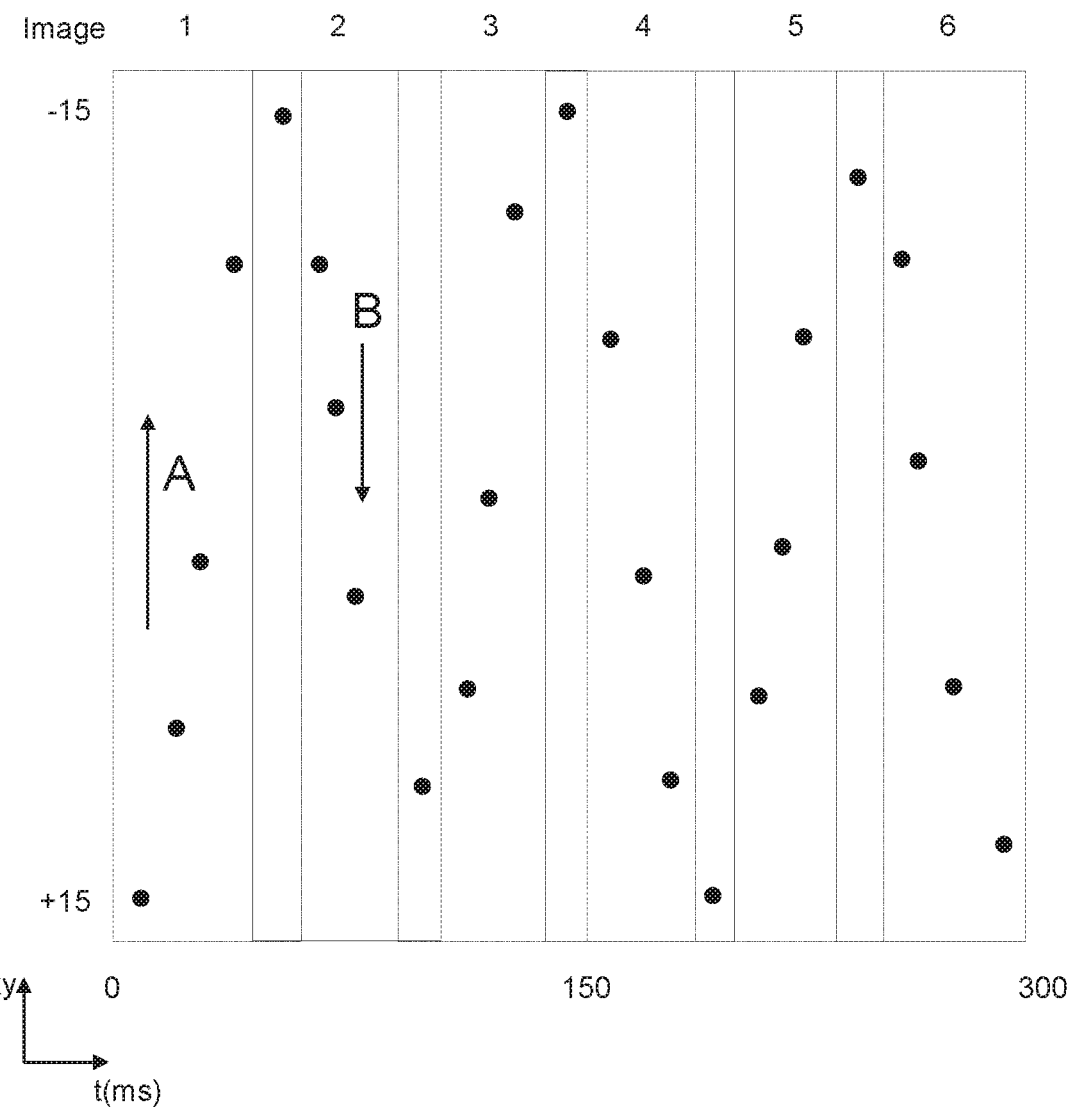
FIG. 9 is a schematic diagram illustrating exemplary sampling trajectories associated with one portion of an image sequence according to some embodiments of the present disclosure.

FIG. 9 is a schematic diagram illustrating exemplary sampling trajectories associated with one portion of an image sequence according to some embodiments of the present disclosure. As shown in FIG. 9, the horizontal axis refers to a time dimension representing one or more consecutive images in an image sequence. The vertical axis refers to a phase encoding dimension representing one or more phase encoding gradient field values. A black spot as shown in FIG. 9 indicates a sampling point with a specific time values and a specific phase encoding gradient field values identified from the sampling pattern. FIG. 8 illustrated sampling points corresponding to each image in the image sequence. FIG. 9 shows an arrangement of the sampling points in time sequence corresponding to each image, also referred to as a sampling trajectory associated with each image. A plurality of sampling trajectories associated with consecutive images (e.g., images 1-6 shown in FIG. 9) may be identified from the sampling pattern as shown in FIG. 8. Two neighboring images may be represented by a rectangle with solid lines and a rectangle with dotted lines respectively. For illustration, FIG. 9 shows one portion of the plurality of sampling trajectories and one portion of consecutive images (e.g., images 1-6 shown in FIG. 9) in an image sequence.

As shown in FIG. 9, each of the 6 consecutive images includes five sampling points. Any two neighboring images have different directions of sampling trajectories and share a sampling point. Taking Image 1, Image 2 and Image 3 as an example, Image 1 and Image 3 are both neighboring images of Image 2. Phase encoding gradient field values corresponding to sampling points of Image 1 change in a descending order along the time dimension such that the sampling trajectory with respect to Image 1 has a descending direction (denoted by arrow A in FIG. 9). Phase encoding gradient field values corresponding to sampling points of Image 2 change in an ascending order along the time dimension such that the sampling trajectory with respect to Image 2 has an ascending direction (denoted by arrow B in FIG. 9). Similar with Image 1, the sampling trajectory with respect to Image 3 has a descending direction. Image 1 and Image 2 share a sampling point at a phase coding gradient field value with the minimum value (e.g., at −15) of phase coding gradient field values associated with Image 1 and Image 2. Image 2 and Image 3 share a sampling point at a phase coding gradient field value with the maximum value (e.g., at +15) of phase coding gradient field values associated with Image 2 and Image 3.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for magnetic resonance imaging (MRI), comprising:
   at least one storage device storing executable instructions, and
   at least one processor in communication with the at least one storage device, when executing the executable instructions, causing the system to:
   obtain a sampling pattern associated with an image sequence, the sampling pattern being associated with a plurality of phase encoding gradient field values;
   obtain k-space data associated with the image sequence using the sampling pattern; and
   reconstruct the image sequence based on the k-space data, wherein the sampling pattern includes a plurality of sampling points, each of the plurality of sampling points denoting a k-space line associated with the k-space data, each of the plurality of phase encoding gradient field values corresponding to one single sampling point during a time period associated with at least two consecutive images in the image sequence.

2. The system of claim 1, wherein the sampling pattern is pseudo-random in a k-space direction.

3. The system of claim 1, wherein at least one segment of the sampling pattern along a phase encoding dimension does not repeat itself in the time period.

4. The system of claim 1, wherein locations of the plurality of sampling points on the sampling pattern are arranged periodically along a time dimension associated with the sampling pattern.

5. The system of claim 1, wherein the sampling pattern includes one or more blocks arranged in a two-dimensional space defined by a time dimension and a phase encoding dimension, each of the one or more blocks including a pre-determined number of sampling points, wherein the pre-determined number of sampling points in each block corresponds to different phase encoding gradient field values and time values.

6. The system of claim 1, wherein the sampling pattern includes at least two segments along a phase encoding dimension of the sampling pattern, phase encoding gradient field values associated with each of the at least two segments corresponding to a same number of sampling points.

7. The system of claim 6, wherein each of the phase encoding gradient field values associated with each of the at least two segments corresponds to one single sampling point during a same time period.

8. The system of claim 6, wherein the at least two segments include a first segment and a second segment, a phase encoding gradient field value associated with the first segment corresponding to one single sampling point during a first time period, a phase encoding gradient field value associated with the second segment corresponding to one single sampling point during a second time period different from the first time period.

9. The system of claim 6, wherein each of the at least two segments includes one or more blocks arranged along a time dimension of the sampling pattern, each of one or more blocks in each of the at least two segments including a pre-determined number of sampling points, wherein the pre-determined number of sampling points in each block corresponds to different phase encoding gradient field values and time values.

10. The system of claim 9, wherein the pre-determined number of sampling points on each of the one or more blocks in each of the at least two segments are different.

11. The system of claim 9, wherein locations of sampling points on each block in at least one of the at least two segments are the same or different.

12. The system of claim 1, wherein the image sequence includes a plurality of consecutive images, and to obtain k-space data associated with the image sequence using the sampling pattern, the at least one processor is further configured to cause the system to:
identify a plurality of sampling trajectories from the target sampling pattern, each of the plurality of sampling trajectories corresponding to one of the plurality of images, each of the plurality of sampling trajectories including a plurality of sampling points arranged in a time sequence;
determine a pulse sequence based on the plurality of sampling trajectories;
collect MR signals based on the pulse sequence; and
determine the k-space data associated with the image sequence based on the MR signals.

13. The system of claim 12, wherein a number of the plurality of sampling points on each of the plurality of sampling trajectories are the same.

14. The system of claim 12, wherein phase encoding gradient field values corresponding to the plurality of sampling points on at least one of the plurality of sampling trajectories vary in a descending order or an ascending order.

15. The system of claim 14, wherein directions of sampling trajectories with respect to two neighboring images are different, wherein a direction of a sampling trajectory is defined by a change of phase encoding gradient field values corresponding to the plurality of sampling points.

16. The system of claim 15, wherein the sampling trajectories with respect to two neighboring images share a sampling point at a phase coding gradient field value, wherein the phase coding gradient field value is a maximum or minimum of the plurality of phase encoding gradient field values associated with the sampling pattern.

17. The system of claim 15, wherein to reconstruct the image sequence based on the k-space data, the at least one processor is further configured to cause the system to:
average at least one portion of the k-space data along the time dimension of the sampling pattern to obtain reference k-space data associated with the image sequence; and
reconstruct the image sequence based on the reference k-space data.

18. A method for magnetic resonance imaging (MRI) implemented on a computing apparatus, the computing apparatus including at least one processor and at least one storage device, the method comprising:
obtaining a sampling pattern associated with an image sequence, the sampling pattern being associated with a plurality of phase encoding gradient field values;
obtaining k-space data associated with the image sequence using the sampling pattern; and
reconstructing the image sequence based on the k-space data, wherein the sampling pattern includes a plurality of sampling points, each of the plurality of sampling points denoting a k-space line associated with the k-space data, each of the plurality of phase encoding gradient field values corresponding to one single sampling point during a time period associated with at least two consecutive images in the image sequence.

19. The method of claim 18, wherein at least one segment of the sampling pattern along a phase encoding dimension does not repeat itself in the time period.

20. A non-transitory computer-readable medium storing at least one set of instructions, wherein when executed by at least one processor, the at least one set of instructions directs the at least one processor to perform acts of:
obtaining a sampling pattern associated with an image sequence, the sampling pattern being associated with a plurality of phase encoding gradient field values;
obtaining k-space data associated with the image sequence using the sampling pattern; and
reconstructing the image sequence based on the k-space data, wherein the sampling pattern includes a plurality of sampling points, each of the plurality of sampling points denoting a k-space line associated with the k-space data, each of the plurality of phase encoding gradient field values corresponding to one single sampling point during a time period associated with at least two consecutive images in the image sequence.

* * * * *